(12) United States Patent
Asakawa (10) Patent No.: US 6,782,512 B2
(45) Date of Patent: Aug. 24, 2004

(54) FABRICATION METHOD FOR A SEMICONDUCTOR DEVICE WITH DUMMY PATTERNS

(75) Inventor: Kazuhiko Asakawa, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 187 days.

(21) Appl. No.: 10/124,391

(22) Filed: Apr. 18, 2002

(65) Prior Publication Data

US 2002/0157076 A1 Oct. 24, 2002

(30) Foreign Application Priority Data

Apr. 23, 2001 (JP) ........................................ 2001-123784

(51) Int. Cl.[7] ............................................. G06F 17/50
(52) U.S. Cl. ............................... 716/1; 716/2; 438/626; 438/633; 438/926
(58) Field of Search .................. 716/1, 2, 21; 438/626, 438/633, 9

(56) References Cited

U.S. PATENT DOCUMENTS

| | | | | |
|---|---|---|---|---|
| 6,211,050 | B1 * | 4/2001 | Wong .......................... | 438/597 |
| 6,253,362 | B1 * | 6/2001 | Anand et al. ................... | 716/8 |
| 6,484,300 | B1 * | 11/2002 | Kim et al. ....................... | 716/7 |
| 6,484,303 | B2 * | 11/2002 | Kitada .......................... | 716/11 |
| 6,487,712 | B1 * | 11/2002 | Kim ............................. | 716/21 |
| 6,563,148 | B2 | 5/2003 | Kawashima et al. | |
| 6,567,964 | B2 * | 5/2003 | Shin et al. ...................... | 716/8 |
| 6,574,789 | B1 * | 6/2003 | Yamauchi ..................... | 716/21 |

FOREIGN PATENT DOCUMENTS

| | | |
|---|---|---|
| JP | 05-175195 A | 7/1993 |
| JP | 06-005594 A | 1/1994 |
| JP | 06-310502 A | 11/1994 |
| JP | 10-125681 | 5/1998 |
| JP | 2000-114258 A | 4/2000 |
| JP | 2002-9161 | 1/2002 |
| JP | 2001-28353 | 1/2003 |

\* cited by examiner

Primary Examiner—Stacy A. Whitmore
(74) Attorney, Agent, or Firm—Rabin & Berdo, P.C.

(57) ABSTRACT

A semiconductor device is fabricated by a method that includes forming a conductive pattern on a semiconductor substrate, covering the conductive pattern with a dielectric layer, and planarizing the dielectric layer by chemical-mechanical polishing. To avoid global height differences, a dummy pattern is added to the conductive pattern if a predetermined condition is satisfied. The condition is based on the calculated density of the conductive pattern in a region including the region in which the dummy pattern is to be added. The calculated density may be adjusted according to the type of equipment used to deposit the dielectric layer, and the dummy pattern dimensions may be adjusted according to the calculated density. Such calculations avoid the need for human judgment and lead to more uniform planarization.

15 Claims, 6 Drawing Sheets

| LOCAL PATTERN DENSITY R | DUMMY PATTERN DIMENSIONS | DUMMY PATTERN SPACING | DUMMY PATTERN DENSITY |
|---|---|---|---|
| 30% < R ≦ 40% | 2×2 μm | 2 μm | 25% |
| 20% < R ≦ 30% | 2.5×2.5 μm | 1.5 μm | 39% |
| R ≦ 20% | 3×3 μm | 1 μm | 56% |

FABRICATION METHOD FOR A SEMICONDUCTOR DEVICE WITH DUMMY PATTERNS

BACKGROUND OF THE INVENTION

1. Field of the Invention

The present invention relates to a method of fabricating a semiconductor device. In particular, it relates to a method of deciding whether to add a dummy pattern to a conductive pattern such as a metal wiring pattern formed on a semiconductor substrate, in order to planarize a dielectric layer covering the conductive pattern.

2. Description of the Related Art

The deposition of a layer of dielectric material to cover a conductive pattern on a semiconductor substrate is a common step in the fabrication of semiconductor devices. This step is often carried out by chemical vapor deposition (CVD).

In a semiconductor device having a multilayer wiring structure, another conductive pattern is formed on the dielectric layer as an upper wiring layer. Before this conductive pattern is formed, the surface of the dielectric layer is planarized by, for example, chemical-mechanical polishing (CMP). CMP produces a flat surface provided the conductive pattern buried within the dielectric layer has a substantially even density.

It is not easy, however, to design a semiconductor device so that the conductive pattern formed on the substrate has an even density, and if density differences exist, the surface of the polished dielectric layer will show global height differences between areas of high pattern density and areas of low pattern density. These global height differences lead to reduced precision when photolithography is used to form the upper wiring layer on the dielectric layer.

A known way to reduce global height differences is to add dummy patterns to the low-density areas, to increase the pattern density in these areas. Conventionally, the circuit designer uses visual estimation to decide where to place dummy patterns.

Estimating by eye where it is necessary to place dummy patterns, however, is a method that depends greatly on the designer's judgment. It may happen, for example, that although the actual density of the conductive pattern in a certain area is comparatively high, the designer perceives the density as low and decides to add a dummy pattern to the area. The pattern density in the area is then further increased, and in the device as a whole, global height differences are aggravated instead of being reduced.

In addition, each designer's judgment differs, and no two designers will decide to form dummy patterns in the same places, so a suitable reduction of global height differences is difficult to achieve.

SUMMARY OF THE INVENTION

An object of the present invention is to provide a method of deciding where to form dummy patterns that can effectively reduce global height differences, thereby enabling semiconductor devices to be fabricated with higher precision than before.

The present invention provides a method of fabricating a semiconductor device in which a conductive pattern formed on a semiconductor substrate is covered by a dielectric layer, and a dummy pattern is added to the conductive pattern so that the dielectric layer can be more flatly planarized. To decide whether to form a dummy pattern in a given region on the semiconductor substrate, the proportion of a prescribed region, including the given region, that is covered by the conductive pattern is calculated, and the decision is based on the calculated proportion (the conductive pattern density). After the conductive pattern and dummy pattern have been formed, the dielectric layer is deposited and planarized by chemical-mechanical polishing. The conductive pattern typically projects above the semiconductor substrate and is electrically connected to circuit elements formed in the semiconductor substrate, while the dummy pattern, which also projects above the semiconductor substrate, is electrically disconnected from the circuit elements.

According to the invented method, the dummy pattern is formed according to a fixed rule, without relying on a designer's judgment. For example, the proportion of the prescribed region covered by conductive pattern may be compared with a predetermined threshold, a dummy pattern being added if the density is equal to or less than the threshold value. Since a fixed rule is followed, an appropriate combined pattern density is consistently obtained, so that when the dielectric layer is planarized, global height differences are consistently reduced.

The semiconductor substrate may be one part of a semiconductor wafer, and may be partitioned into square or rectangular sections, the given region being one of the square or rectangular sections and the prescribed region comprising one or more of the square or rectangular sections. If composed of two or more of the square or rectangular sections, the prescribed region itself may have a square or rectangular shape.

The decision as to whether to form the dummy pattern may be based on an adjusted proportion different from the actual proportion of the prescribed region covered by the conductive pattern. The adjustment may be made to allow for a difference between the area of the conductive pattern and the area of the raised portions of the dielectric layer formed above the conductive pattern. For example, if a parallel-plate type of plasma CVD apparatus is used to deposit the dielectric layer, the raised portions of the dielectric layer are larger than the conductive pattern; the adjusted proportion then preferably exceeds the actual proportion. If a high-density plasma CVD apparatus is used, the raised portions of the dielectric layer are smaller than the conductive pattern, and the adjusted proportion is preferably less than the actual proportion.

The dimensions of the dummy pattern may be varied according to proportion of the prescribed region covered by the conductive pattern. For example, the dummy pattern dimensions may be increased as the proportion of the prescribed region covered by the conductive pattern decreases. In particular, the dimensions may be varied so that the sum of the dummy pattern density in the given region and the conductive pattern density in the prescribed region exceeds a predetermined threshold.

The present invention also provides a method of deciding whether to form a dummy pattern in a given region on a semiconductor substrate. The ratio of the area of the conductive pattern in the prescribed region to the area of a prescribed region including the given region is calculated, and the dummy pattern is formed if the ratio is less than a predetermined threshold. The calculated area of the conductive pattern may differ from the actual area.

DETAILED DESCRIPTION OF THE INVENTION

Embodiments of the invention will now be described with reference to the attached drawings, in which like elements are indicated by like reference characters.

Figure 1:
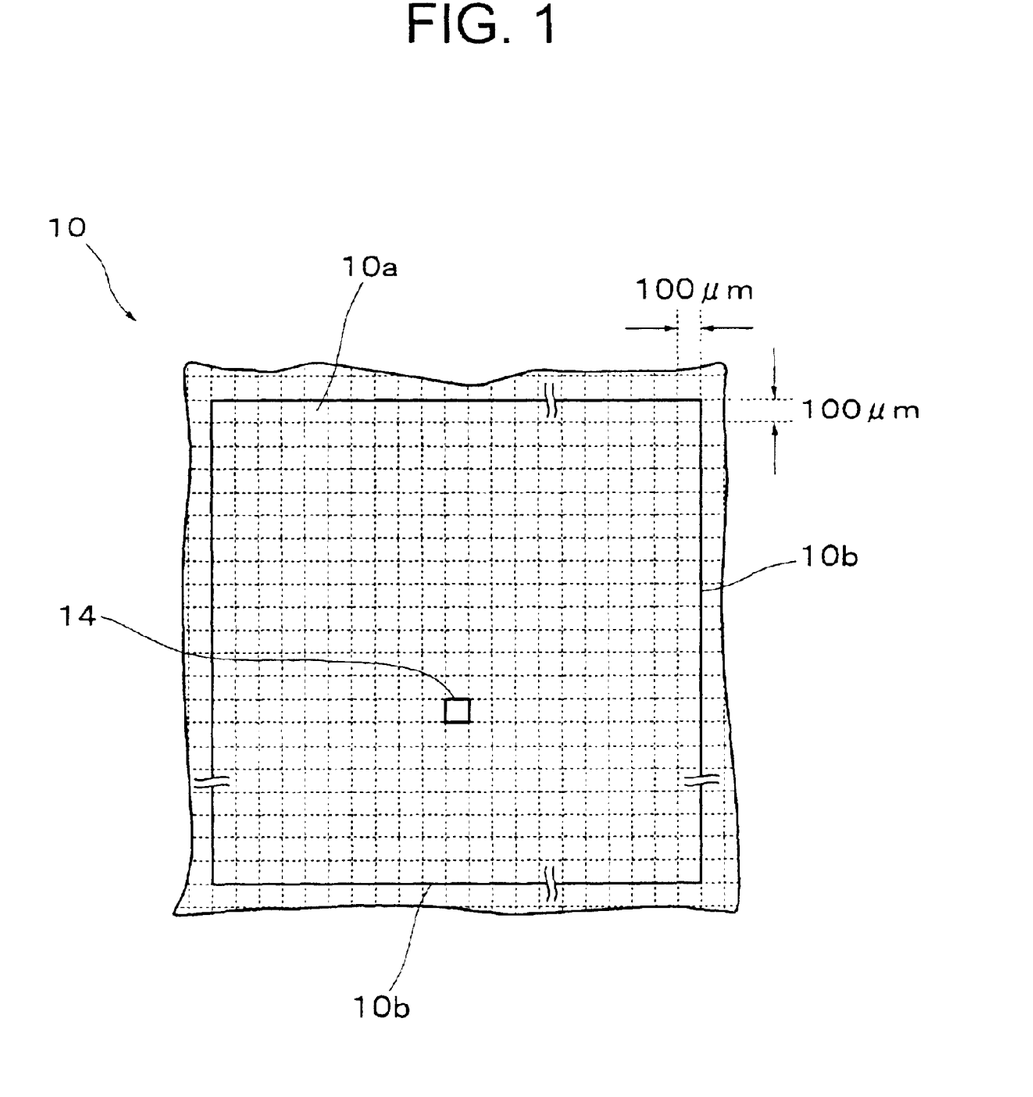
FIG. 1 is a plan view of a semiconductor substrate partitioned into sections according to a first embodiment of the invention.

In a first embodiment of the invented method of fabricating a semiconductor device, a semiconductor wafer is divided by grid lines into a plurality of chip areas, and a separate semiconductor device is formed in each chip area. FIG. 1 shows one chip area 10a and its surrounding grid lines 10b on the semiconductor wafer 10.

Figure 2:
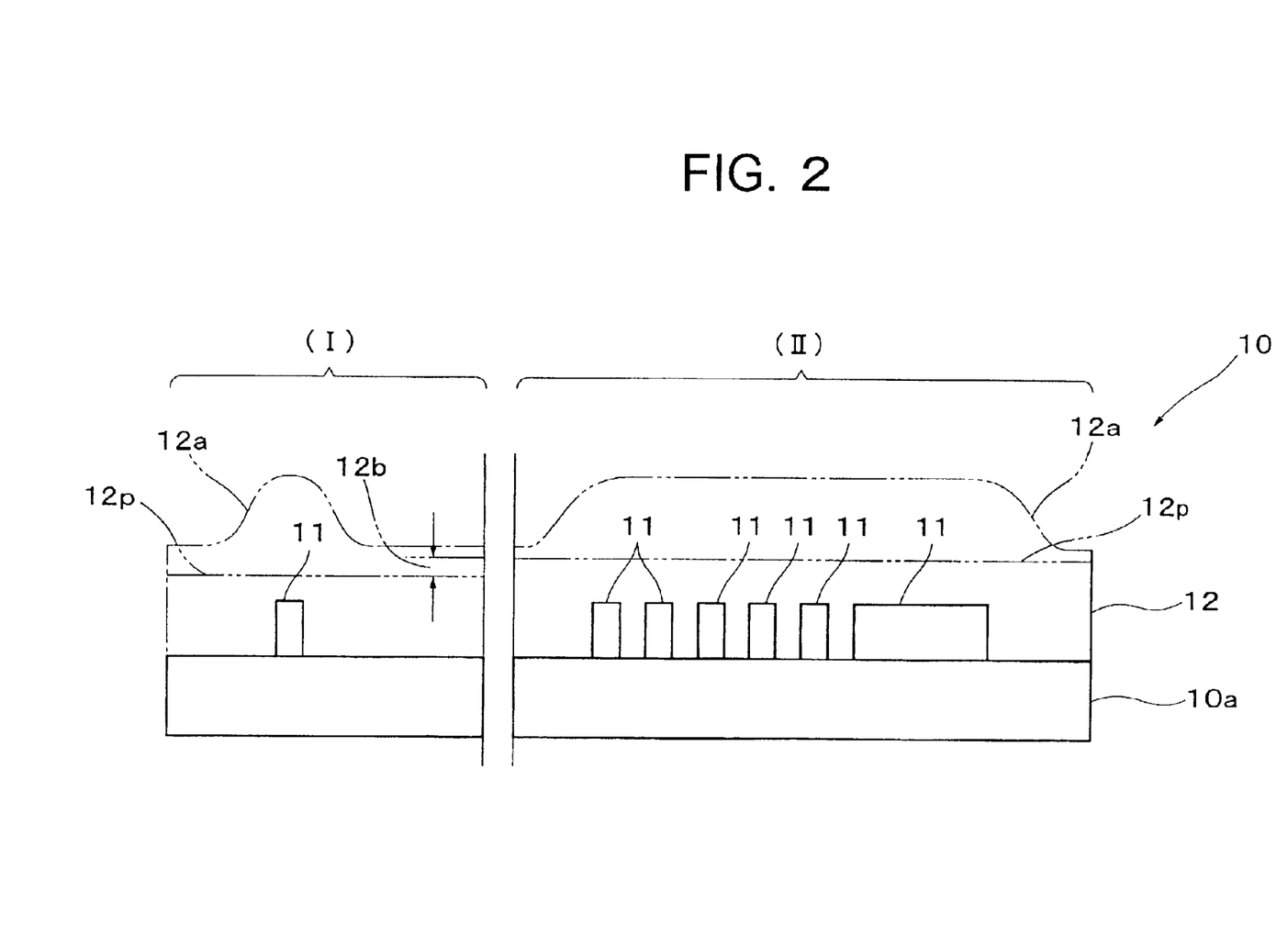
FIG. 2 is a side view of a semiconductor device having a dielectric layer formed without a dummy pattern.

FIG. 2 illustrates the deposition of a dielectric layer 12 to cover a conductive pattern 11 such as a well-known type of metal wiring pattern which is formed in each chip area 10a on the semiconductor wafer 10; as noted earlier, the deposition of such a dielectric layer 12 is a common step in the fabrication of semiconductor devices. The conductive pattern 11 projects above the chip area 10a and is electrically connected to circuit elements formed in the semiconductor substrate. The dielectric layer 12 may be deposited by a parallel-plate type of plasma CVD apparatus, for example, or a high-density plasma CVD apparatus. In either case, raised portions 12a of the dielectric layer 12 are formed above the conductive pattern 11.

When sparse areas (I) in which the density of the conductive pattern 11 is comparatively low and dense areas (II) in which the density of the conductive pattern 11 is comparatively high coexist on the chip area 10a, the tops of raised portions 12a have different shapes in the sparse areas than in the dense areas. In the dense areas (II), the cross sections of the tops of the raised portions 12a have a comparatively flat profile; in the sparse areas (I), these have a more steeply varying profile, as shown in FIG. 2.

The dielectric layer 12 is planarized by a CMP apparatus that pushes a rotating pad against the tops of the raised portions 12a. The pad is formed from an elastic material such as foam polyurethane and has a flat polishing surface. The polishing action removes the raised portions 12a and some of the underlying dielectric material, down to line 12p, for example. Since the cross section of the tops of the raised portions 12a is steeper in the sparse areas (I) than in the dense areas (II), the polishing pressure of the pad tends to be concentrated more intensely on the tops of the raised portions 12a in the sparse areas. The dielectric layer is therefore polished more rapidly in the sparse areas than that in the dense areas, and this yields a global height difference 12b in the surface of the polished dielectric layer 12.

Figure 3:
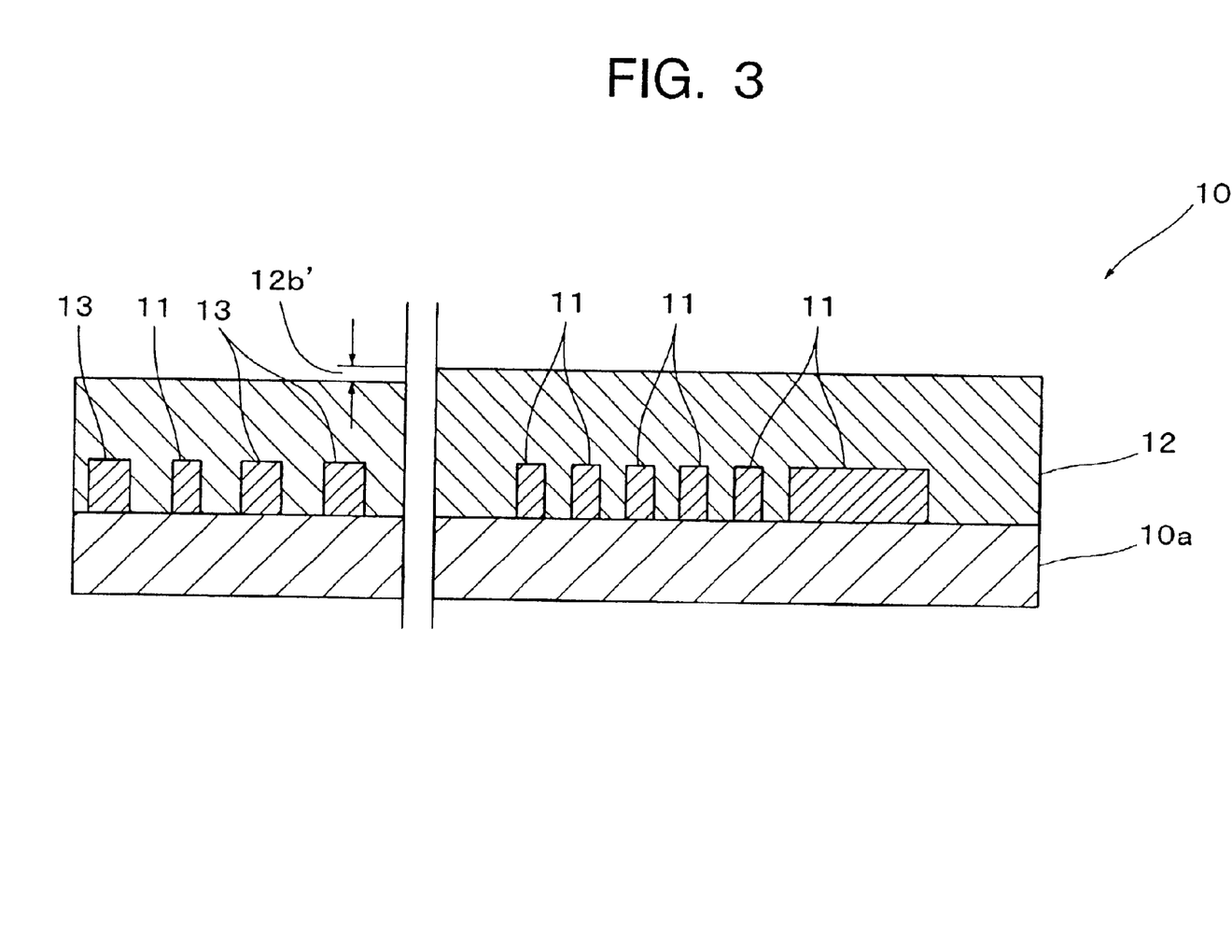
FIG. 3 is a sectional view of a semiconductor device having a dielectric layer formed with a dummy pattern as in the first embodiment.

A known way to reduce the global height difference 12b is, as shown in FIG. 3, to add dummy patterns 13 projecting above the substrate area left uncovered by the conductive pattern 11 on the chip area 10a. A dummy pattern 13 is similar to the conductive pattern 11 described above, but is not electrically connected to the circuit elements formed on the chip area 10a. The dummy patterns 13 may be designed after the conductive pattern that is to be used as interconnection wiring has been designed, for example. In the following description, all of the dummy patterns 13, or all of the dummy patterns 13 in a given region, will sometimes be referred to collectively as a single dummy pattern.

In the first embodiment of the invented method, when the dummy pattern is designed, as shown in FIG. 1, the entire surface of the semiconductor wafer 10, including a plurality of chip areas 10a, is divided into square or rectangular sections. In the following description, the semiconductor wafer 10 is partitioned by grid lines that divide each chip area, e.g., the chip area 10a in FIG. 1, into square sections 14 measuring one hundred micrometers (100 μm) on a side.

Needless to say, the invention is not limited to this dimension. The sections may have any suitable size, provided each chip area 10a is divided into a plurality of sections.

In the first embodiment, each section 14 is treated as both a given region and a prescribed region. Dummy patterns 13 are added on a section-by-section basis, according to the ratio of the area of the conductive pattern 11 in each section 14 to the area of the section 14 itself. This ratio, which is equal to the density of the conductive pattern 11 in the section 14, is calculated when the conductive pattern is designed.

In the first embodiment, whether to form a dummy pattern 13 or not in a given section 14 is determined according to a density threshold of, for example, twenty-five percent (25%). If the calculated value of the pattern density is equal to or less than 25%, the section 14 is regarded as a sparse area in which a dummy pattern 13 needs to be formed. If the value of the pattern density is greater than the 25% threshold (if the pattern density is 50%, for example), the section 14 is regarded as a dense area in which it is not necessary to form a dummy pattern 13. After this decision has been made, a suitable dummy pattern 13 is laid out if the result of the decision is that a dummy pattern is needed.

The dummy pattern can be laid out by, for example, simulation on a computer. In the simulation process, a dummy pattern model or template is superposed on the section 14, and the dummy pattern layout is copied from the template into the areas not overlapping the conductive pattern 11. In plan view, the template comprises, for example, dummy squares measuring two micrometers (2 μm) on a side, separated from one another by equal intervals of 2 μm. When the dummy pattern is laid out, if necessary, this simulation can be performed for each section 14 of the chip area 10a, thereby determining the layout of the dummy pattern 13 in the entire chip area 10a.

After that, the conductive pattern 11 and the dummy pattern 13 are formed simultaneously on the semiconductor wafer 10, in each chip area 10a, by well-known photolithographic techniques, using a photo-resist mask that defines both the conductive pattern 11 and the dummy pattern 13. After the conductive pattern 11 and the dummy pattern 13 are formed, CVD apparatus is used to deposit the dielectric layer 12 on the semiconductor wafer 10 to cover the conductive pattern 11 and dummy pattern 13, and CMP apparatus is used to planarize the dielectric layer.

In the invented method, since dummy patterns 13 are formed only in areas which are determined by strict criteria to be sparse, the density difference between the sparse areas (I) and the dense areas (II) is reduced, and since the addition of a dummy pattern increases the pattern density in the sparse areas, the tops of the raised portions 12a of the dielectric layer 12 in the sparse areas are flatter than they would be without dummy pattern formation. As a result, and the global height difference 12b' left in FIG. 3 after CMP planarization of the dielectric layer is smaller than the global height difference 12b in FIG. 2.

In the first embodiment of the invented method, the dummy pattern 13 is added according to a simple and direct rule, by deciding whether to form a dummy pattern 13 together with the conductive pattern 11 in each section 14 of the chip area 10a according to the density of the conductive pattern 11 in the section 14. The decision is made according to a density threshold, without relying on a designer's judgment. This prevents the dummy pattern 13 from being formed inappropriately in dense parts (II) of the chip area 10a. When the dielectric layer 12 covering the conductive pattern 11 and the dummy pattern 13 is planarized, global height differences are consistently reduced.

Figure 4:
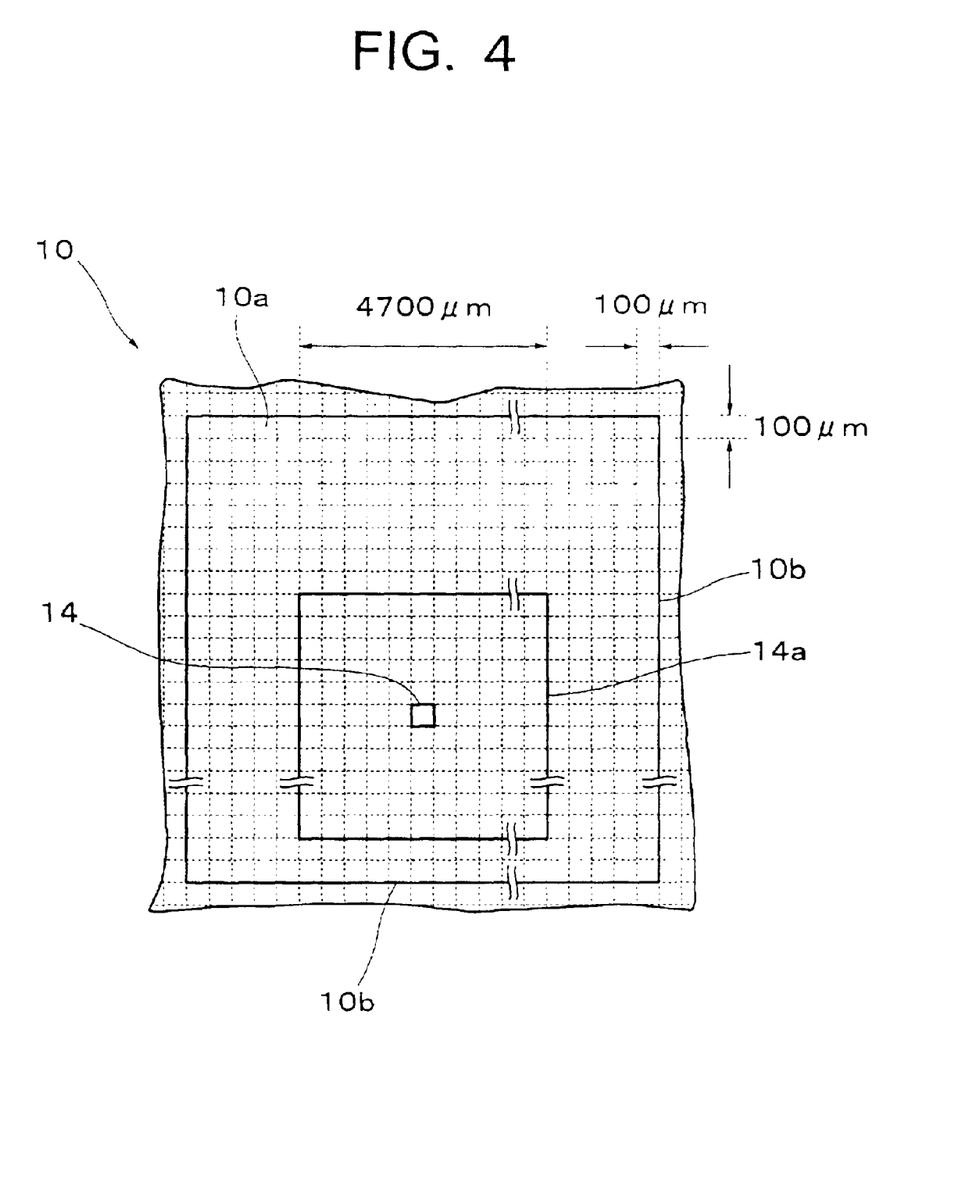
FIG. 4 is a plan view, similar to FIG. 1, of a semiconductor substrate, illustrating a method of calculating a pattern density according to a second embodiment of the invention.

In a second embodiment of the invented method of fabricating a semiconductor device, whether to form a dummy pattern 13 in a given section 14 of the chip area 10a is determined by finding the density of the conductive pattern 11 in a prescribed region 14a that includes a plurality of sections surrounding the given section 14, as shown in FIG. 4.

The prescribed region 14a is a square measuring four thousand seven hundred micrometers (4700 µm) on a side, centered on the given section 14 as illustrated. The size of the square may be varied according to the type of CMP apparatus used for planarization and the polishing conditions, such as the material of the polishing pad and its rotational speed. When the given section 14 is located near the boundary of a chip area 10a on the semiconductor wafer 10, the prescribed region 14a may overlap the boundary, so that the prescribed region 14a includes part of the adjacent chip area on the semiconductor wafer 10.

In the second embodiment of the invented method, for each section 14 of the chip area 10a, the ratio of the area of the conductive pattern 11 in the prescribed region 14a surrounding the section 14 to the area of the prescribed region 14a is calculated. That is, the density of the conductive pattern 11 in the prescribed region 14a is obtained to decide whether to form a dummy pattern 13 in the section 14. The decision is thus based on the local density of the conductive pattern 11 in a locality that surrounds and is centered on the given section 14 for which the decision is being made, by comparing the local pattern density with a threshold.

The same threshold can be used as in the first embodiment, (e.g., 25%). If the result of the comparison is that the local pattern density is equal to or less than the threshold, a dummy pattern 13 is laid out in the section 14 located at the center of the prescribed region 14a. If the local pattern density is greater than the threshold, no dummy pattern 13 is laid out in the section 14.

After the conductive pattern 11 and, where necessary, the dummy pattern 13 have been formed, a dielectric layer 12 is deposited covering them, and the dielectric layer 12 is planarized by use of a CMP apparatus in the same way as in the first embodiment.

In the second embodiment of the invented method, since whether to form a dummy pattern 13 is determined for each section 14 of the chip area 10a according to the local pattern density in a prescribed region surrounding the section 14, the decision is more accurate than in the first embodiment, because it takes account of density interactions between the section 14 and the surrounding area.

In a third embodiment of the invented method of fabricating a semiconductor device, the local pattern density in a prescribed region 14a that surrounds each section 14 of the chip area 10a is used as in the second embodiment, as shown in FIG. 4, in order to decide whether to form a dummy pattern 13 in the prescribed region 14, but the local pattern density is calculated from adjusted dimensions of the conductive pattern.

When a dummy pattern is designed as described in the first and second embodiments, the pattern density or local pattern density is calculated from pattern dimensions that correspond to the actual dimensions of the top of the conductive pattern 11.

When CVD apparatus is used to deposit the dielectric layer 12, the cross-sectional shape of the raised portions 12a formed where the dielectric layer 12 covers the conductive pattern 11 has different features depending on the type of CVD apparatus used.

Figure 5:
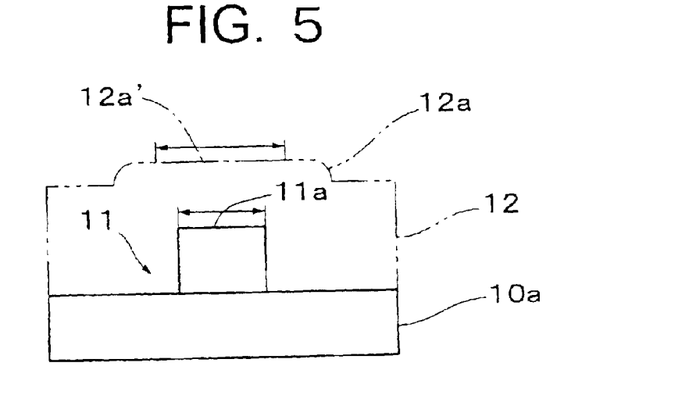
FIG. 5 is a side view of a semiconductor device with a dielectric layer formed by use of a parallel-plate type of plasma CVD apparatus.

If the dielectric layer 12 is deposited by use of a parallel-plate type of plasma CVD apparatus, for example, the cross section of the raised portion 12a usually has a top part 12a' that is wider than the top part 11a of the conductive pattern 11, as seen in FIG. 5. The area of the top part 12a' of the raised portion 12a, that is, the area of contact between the raised portion 12a of the dielectric layer 12 and the polishing pad of the CMP apparatus is, therefore, actually larger than the area of the top part 11a of the conductive pattern 11.

Figure 6:
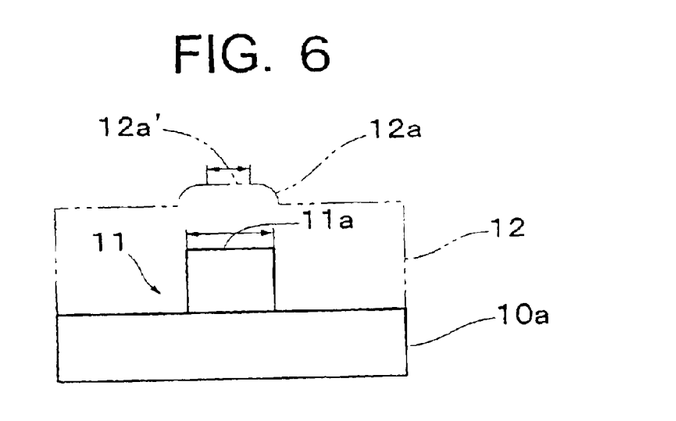
FIG. 6 is a side view of a semiconductor device with a dielectric layer formed by use of a high-density plasma CVD apparatus.

If the dielectric layer 12 is deposited by use of a high-density plasma CVD apparatus, in the cross section of the raised portion 12a of the dielectric layer 12, the top part 12a' is narrower than the top part 11a of the conductive pattern 11, as shown in FIG. 6, and the area of the top part of the raised portion 12a is actually smaller than that of the conductive pattern 11.

In the third embodiment of the invented method, when the area of the top of the raised portion 12a of the dielectric layer 12 differs from the area of the top of the conductive pattern 11 in this way, before the local pattern density of the conductive pattern 11 is calculated, the area of the conductive pattern 11 is adjusted to reduce the difference. That is, a sizing adjustment is performed.

Figure 7:
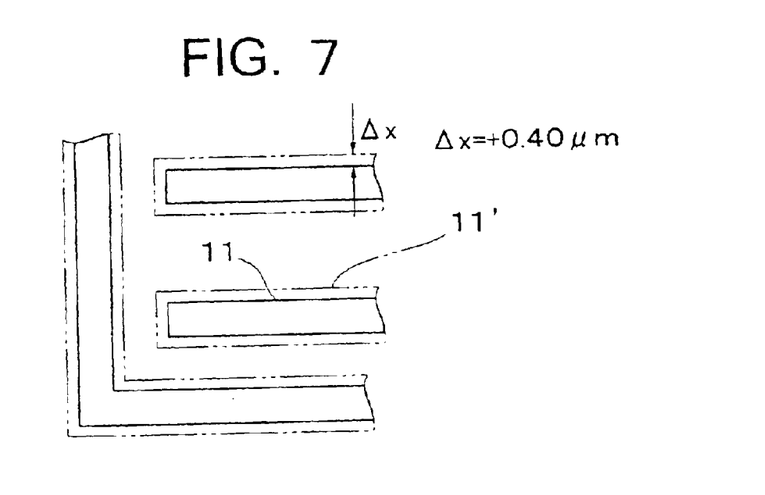
FIG. 7 is a plan view of a conductive pattern illustrating a sizing adjustment made according to a third embodiment of the invention.

If a parallel-plate type of plasma CVD apparatus is used to deposit the dielectric layer 12, the sizing adjustment is performed by plotting an imaginary enlarged periphery around the conductive pattern 11 that is to be formed as an interconnection wiring pattern, as shown in FIG. 7, in order to increase the calculated area of the conductive pattern 11 in the section 14a to that of the top part 12a' of the raised portion 12a of the dielectric layer 12 in the prescribed region 14a. The amount ($\Delta x$) by which the periphery is enlarged is, for example, +0.40 µm.

If a high-density plasma CVD apparatus is used for deposition of the dielectric layer 12, as described above, since the area of the top part 12a' of the raised portion 12a of the dielectric layer 12 is smaller than the area of the top part 11a of the conductive pattern 11, a negative value may be used for the sizing adjustment dimension.

The amount (Δx) is +0.40 μm in FIG. 7, but of course the invention is not limited to this dimension. The amount may have any suitable size, according to the cross-sectional shape and area of the raised portion 12a of the deposited dielectric layer 12.

In each given section 14 of the chip area 10a, the local pattern density in the prescribed region 14a is calculated according to the enlarged or reduced conductive pattern 11' resulting from the sizing adjustment, and whether to form a dummy pattern in the given section 14 is determined according to the local pattern density obtained in this way. After that, the dielectric layer 12 is deposited and planarized as in the second embodiment.

Since the sizing adjustment is performed according to the cross-sectional shape characteristics of the dielectric layer 12 to be deposited, when the local pattern density is calculated it reflects the density of the tops of the raised portions 12a of the dielectric layer 12, that is, the density of the parts of the dielectric layer 12 that will be attacked by the polishing pad during planarization. This is a more rational criterion than the density of the conductive pattern 11, so global height differences can be reduced still further.

In the third embodiment, as in the preceding embodiments, whether to form the dummy pattern 13 is determined according to a density threshold in each section 14 of the substrate, without relying on a designer's judgment. Moreover, since the local pattern density used in the decision is obtained by taking account of the cross-sectional shape of the raised portion 12a of the dielectric layer 12 that will be formed by the particular type of CVD apparatus that will be used, the global height differences can be reduced with a high degree of accuracy.

In a fourth embodiment of the invented method of fabricating a semiconductor device, when dummy patterns 13 are laid out on the chip area 10a, the plan-view dimensions of the dummy patterns 13 and the spaces between them are determined according to the local pattern density, which is obtained as described in the third embodiment.

In the fourth embodiment, the threshold value is 40%. A dummy pattern 13 is laid out in the section 14 located at the center of any prescribed region 14a in which the calculated local pattern density is equal to or less than 40%. The dummy pattern 13 comprises squares having dimensions and spacing that depend on the local pattern density as shown in the table in FIG. 8. In this table, although the size of the dummy squares varies according to the local pattern density, the number of dummy squares in a given region does not vary, since the sum of the width of the squares and the space between the squares is always 4 μm (one square is formed every 4 μm).

Figure 8:
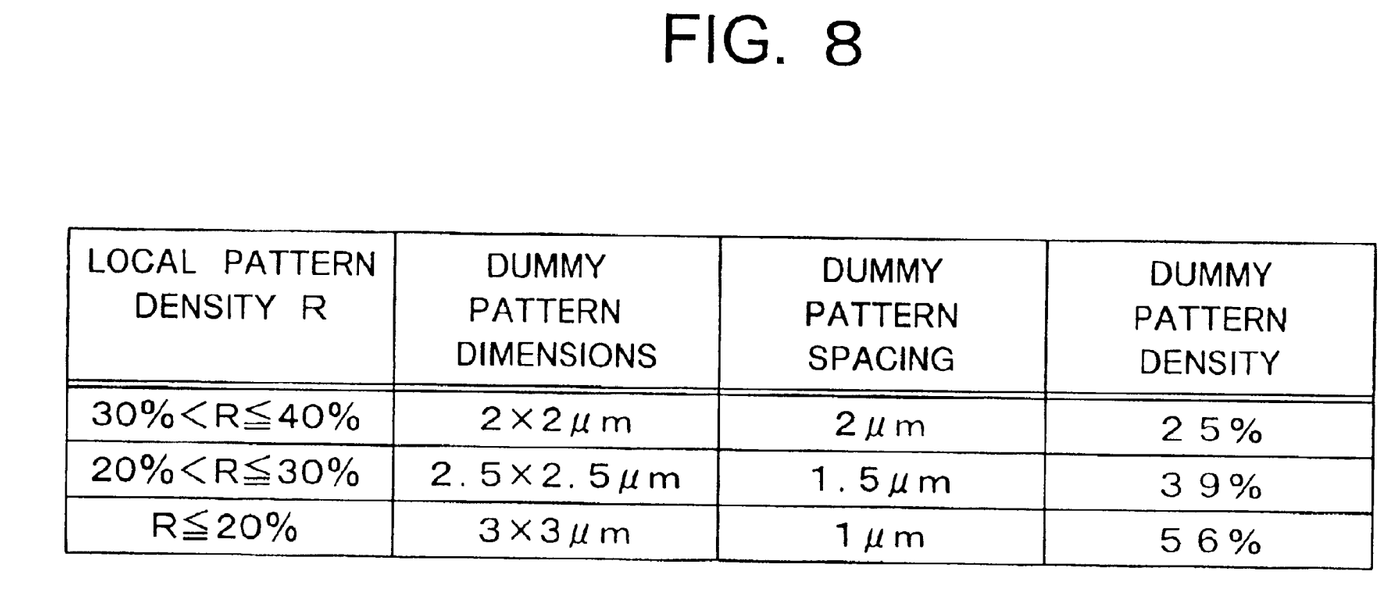
FIG. 8 is a table of dummy pattern dimensions in a fourth embodiment of the invention.

In the fourth embodiment, as shown in FIG. 8, when the calculated local pattern density is greater than 30% but equal to or less than 40%, the dummy pattern 13 consists of squares measuring 2 μm on a side, spaced at equal intervals of 2 μm. The density of the dummy pattern 13 is thus 25%. When this density is added to the local pattern density (the density of the conductive pattern 11 in the prescribed region 14a), the sum is greater than the 40% threshold value.

When the local pattern density is greater than 20% but equal to or less than 30%, the dummy pattern 13 consists of squares measuring 2.5 μm on a side, spaced at equal intervals of 1.5 μm. The density of the dummy pattern 13 is then 39%, and when this density is added to the local pattern density, the sum is again greater than the 40% threshold value.

When the local pattern density is equal to or less than 20%, the dummy pattern 13 consists of squares measuring 3 μm on a side, spaced at equal intervals of 1 μm. The density of the dummy pattern 13 is now 56%, which is greater than the 40% threshold value even without addition of the local pattern density.

Thus in the fourth embodiment, the lower the local pattern density is in the prescribed region 14a surrounding a section 14, the greater the dimensions of the dummy pattern 13 laid out in the section 14 become. Regardless of how low the calculated local pattern density is, sufficient dummy pattern 13 is added to make the sum of the dummy pattern density and the local density of the conductive pattern 11 exceed the 40% threshold value. Variations in the combined density of the conductive pattern 11 and dummy pattern 13 are therefore reduced, as compared with the preceding embodiments, leading to a still greater reduction of global height differences.

Furthermore, since the dimensions of the dummy pattern squares are varied without varying the number of squares, the dummy pattern density can be increased efficiently, without increasing the number of dummy pattern squares that have to be laid out, or the amount of memory space devoted to the dummy pattern layout in the design file.

The four embodiments described above can be modified in numerous ways. The dimensions and threshold values given above can be modified, for example. In the third embodiment, the calculated pattern density can be adjusted by a mathematical formula, without performing a sizing adjustment on the periphery of the conductive pattern. In the fourth embodiment, the dummy pattern dimensions can be varied continuously according to the local pattern density, instead of being varied in steps.

In a semiconductor device with multiple dielectric layers covering respective conductive pattern layers, the invented method can be applied to the formation of dummy patterns in each of the conductive pattern layers.

Those skilled in the art will recognize that further variations are possible within the scope claimed below.

What is claimed is:

1. A method of fabricating a semiconductor device on a semiconductor substrate, comprising:

designing a conductive pattern to be formed on the semiconductor substrate;

performing a sizing adjustment by plotting an imaginary periphery of the conductive pattern, the imaginary periphery being enlarged, with respect to the conductive pattern, if the conductive pattern will be formed by parallel-plate plasma chemical vapor deposition, and narrowed, with respect to the conductive pattern, if the conductive pattern will be formed by high-density plasma chemical vapor deposition;

deciding, for a given region on the semiconductor substrate, whether to add a dummy pattern to the conductive pattern in the given region, by selecting a prescribed region including the given region and determining what proportion of the prescribed region is disposed within the imaginary periphery;

forming the conductive pattern and dummy pattern on the semiconductor substrate;

depositing a dielectric layer on the semiconductor substrate, covering the conductive pattern and the dummy pattern; and planarizing the dielectric layer by chemical mechanical polishing.

2. The method of claim 1, wherein the conductive pattern is electrically connected to circuit elements formed in the semiconductor substrate, the dummy pattern is electrically disconnected from said circuit elements, and the conductive pattern and the dummy pattern both project above the semiconductor substrate.

3. The method of claim 1, wherein the semiconductor substrate is one part of a semiconductor wafer.

4. The method of claim 1, wherein deciding whether to form a dummy pattern further comprises:
   determining a density of the conductive pattern in the prescribed region;
   comparing said density with a predetermined threshold; and
   if said density is less than the predetermined threshold, adding sufficient dummy pattern to the conductive pattern in the given region so that the added dummy pattern has a density that, when added to the density of the conductive pattern in the prescribed region, yields a sum exceeding the predetermined threshold.

5. The method of claim 4, further comprising partitioning the semiconductor substrate into rectangular sections, the given region being one of the rectangular sections, the prescribed region being identical to the given region.

6. The method of claim 5, wherein the rectangular sections are square.

7. The method of claim 1, further comprising adjusting dimensions of the dummy pattern formed in the given region according to said proportion.

8. A method of fabricating a semiconductor device on a semiconductor substrate, comprising:
   designing a conductive pattern to be formed on the semiconductor substrate;
   partitioning the semiconductor substrate into rectangular sections, the given region being one of the rectangular sections;
   deciding, for a given region on the semiconductor substrate, whether to add a dummy pattern to the conductive pattern in the given region, by
      selecting a prescribed region including the given region and determining what proportion of the prescribed region is covered by the conductive pattern,
      determining a density of the conductive pattern in the prescribed region,
      comparing said density with a predetermined threshold, and
      if said density is less than the predetermined threshold, adding sufficient dummy pattern to the conductive pattern in the given region so that the added dummy pattern has a density that, when added to the density of the conductive pattern in the prescribed region, yields a sum exceeding the predetermined threshold;
   forming the conductive pattern and dummy pattern on the semiconductor substrate;
   depositing a dielectric layer on the semiconductor substrate, covering the conductive pattern and the dummy pattern; and
   planarizing the dielectric layer by chemical mechanical polishing,
   wherein the given region is one of the rectangular sections, and the prescribed region comprises a plurality of the rectangular sections surrounding the given region.

9. The method of claim 8, wherein the prescribed region has a predetermined size and a rectangular shape.

10. The method of claim 9, wherein the rectangular sections are square.

11. A method of fabricating a semiconductor device on a semiconductor substrate, comprising:
   designing a conductive pattern to be formed on the semiconductor substrate;
   deciding, for a given region on the semiconductor substrate, whether to add a dummy pattern to the conductive pattern in the given region, by
      selecting a prescribed region including the given region and determining what proportion of the prescribed region is covered by the conductive pattern, and
      determining an adjusted portion of the prescribed region covered by the conductive pattern, the adjusted portion differing from an actual portion of the prescribed region covered by the conductive pattern, the decision as to whether to add the dummy pattern being based on the adjusted portion;
   forming the conductive pattern and dummy pattern on the semiconductor substrate;
   depositing a dielectric layer on the semiconductor substrate, covering the conductive pattern and the dummy pattern; and
   planarizing the dielectric layer by chemical mechanical polishing,
   wherein the adjusted proportion exceeds the actual proportion, and the depositing of the dielectric layer forms raised portions of the dielectric layer above the conductive pattern, the raised portions having tops with a larger area than the conductive pattern.

12. The method of claim 11, wherein a parallel-plate type of plasma chemical vapor deposition apparatus is used to deposit the dielectric layer.

13. A method of fabricating a semiconductor device on a semiconductor substrate, comprising:
   designing a conductive pattern to be formed on the semiconductor substrate;
   deciding, for a given region on the semiconductor substrate, whether to add a dummy pattern to the conductive pattern in the given region, by
      selecting a prescribed region including the given region and determining what proportion of the prescribed region is covered by the conductive pattern, and
      determining an adjusted portion of the prescribed region covered by the conductive pattern, the adjusted portion differing from an actual portion of the prescribed region covered by the conductive pattern, the decision as to whether to add the dummy pattern being based on the adjusted portion;
   forming the conductive pattern and dummy pattern on the semiconductor substrate;
   depositing a dielectric layer on the semiconductor substrate, covering the conductive pattern and the dummy pattern; and
   planarizing the dielectric layer by chemical mechanical polishing,
   wherein the adjusted proportion is less than the actual proportion, and the depositing of the dielectric layer forms raised portions of the dielectric layer above the conductive pattern, the raised portions having tops with a smaller area than the conductive pattern.

14. The method of claim 13, wherein a high-density plasma chemical vapor deposition apparatus is used to deposit the dielectric layer.

15. A method of deciding whether to form a dummy pattern in a semiconductor substrate area left uncovered by a conductive pattern in a semiconductor device, comprising:

calculating an area of a prescribed region including the uncovered semiconductor substrate region;

calculating an area of the conductive pattern in the prescribed region;

calculating a ratio of the calculated area of the conductive pattern to the calculated area of the prescribed region; and comparing said ratio with a predetermined threshold, the dummy pattern being formed if the ratio is less than the predetermined threshold;

wherein the calculated area of the conductive pattern in the prescribed region differs from an actual area of the conductive pattern in the prescribed region, being larger than the actual area of the conductive pattern if the conductive pattern will be formed by parallel-plate plasma chemical vapor deposition, and smaller than the actual area of the conductive pattern if the conductive pattern will be formed by high-density plasma chemical vapor deposition.

* * * * *